US007880945B2

United States Patent
Fan et al.

(10) Patent No.: US 7,880,945 B2
(45) Date of Patent: Feb. 1, 2011

(54) HOLOGRAM PROJECTION SCREEN AND ITS MANUFACTURING METHOD AND SYSTEM AS WELL AS ITS APPLICATIONS

(75) Inventors: Cheng Fan, Guangdong (CN); Zhisen Cai, Guangdong (CN); Chonglai Ke, Guangdong (CN)

(73) Assignee: AFC Technology Co., Ltd., Shenzhen (CN)

( * ) Notice: Subject to any disclaimer, the term of this patent is extended or adjusted under 35 U.S.C. 154(b) by 225 days.

(21) Appl. No.: 11/468,414

(22) Filed: Aug. 30, 2006

(65) Prior Publication Data

US 2007/0146842 A1    Jun. 28, 2007

(30) Foreign Application Priority Data

Dec. 23, 2005    (CN)    ............ 2005 1 0022425

(51) Int. Cl.
- G02B 5/32    (2006.01)
- G02B 3/00    (2006.01)
- G03H 1/00    (2006.01)
- B29D 11/00    (2006.01)

(52) U.S. Cl. ............... 359/15; 359/19; 359/30; 264/1.32

(58) Field of Classification Search ............ 359/19
See application file for complete search history.

(56) References Cited

U.S. PATENT DOCUMENTS

| 5,193,014 | A  | * | 3/1993  | Takenouchi et al. ........... 359/3 |
| 5,521,724 | A  | * | 5/1996  | Shires ........................ 359/22 |
| 6,163,391 | A  | * | 12/2000 | Curtis et al. ................ 359/29 |
| 6,303,276 | B1 | * | 10/2001 | Savant et al. ................ 430/321 |
| 6,441,930 | B1 | * | 8/2002  | Hart .......................... 359/35 |
| 2002/0090578 | A1 | * | 7/2002  | Schaefera et al. ........... 430/320 |
| 2002/0154349 | A1 | * | 10/2002 | Halldorsson et al. ......... 359/15 |
| 2003/0223102 | A1 | * | 12/2003 | Thor et al. .................. 359/15 |
| 2004/0027630 | A1 | * | 2/2004  | Lizotte ....................... 359/15 |

* cited by examiner

Primary Examiner—Stephone B Allen
Assistant Examiner—Jade R Chwasz
(74) Attorney, Agent, or Firm—Hamre, Schumann, Mueller & Larson, P.C.

(57) ABSTRACT

A method for manufacturing a hologram projection screen includes the steps of: 1) recording hologram lens information on a photoresist plate; 2) metalizing the photoresist plate that has been exposed, to produce a master nickel plate of a hologram lens array through electroforming and joining; and 3) using the master nickel plate to emboss thermoplastic material, to obtain a screen body, on which the information of the hologram lens array is arranged. The hologram projection screen manufactured by this method can provide a variety of display contents.

Figure 1:
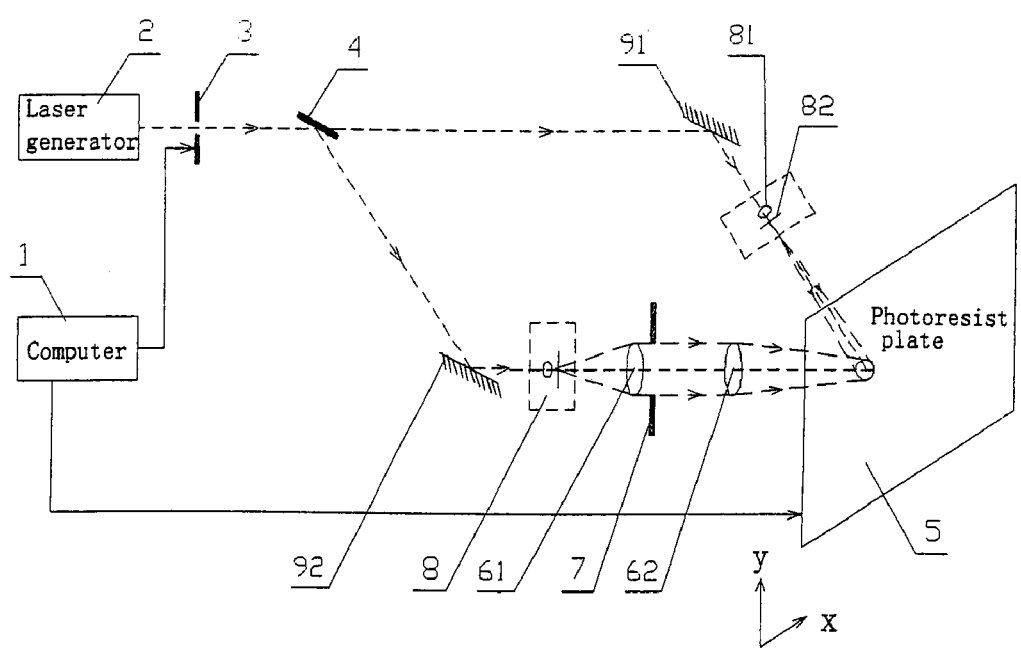

2 Claims, 9 Drawing Sheets

HOLOGRAM PROJECTION SCREEN AND ITS MANUFACTURING METHOD AND SYSTEM AS WELL AS ITS APPLICATIONS

TECHNICAL FIELD

The present invention relates to optical field, and particularly relates to a hologram projection screen and its manufacturing method and system as well as its applications.

BACKGROUND

A projection screen, as the carrier of images of a projector, plays an important role in a projection system. Even a good quality projector would not provide an optimal effect without a high quality projection screen that could match the projector. Conventional projection screens only provide tedious displaying effects.

SUMMARY OF THE INVENTION

To overcome the defects of conventional projection screens, the object of the invention is to provide a hologram projection screen and its manufacturing method and system as well as its applications, that could provide a variety of displaying effects.

The hologram projection screen of the present invention includes a screen body, onto which the information of a hologram lens array is arranged.

The above hologram lenses are equally arranged onto the screen body vertically and horizontally.

The above hologram lenses are arranged onto the screen body adjacent to each other.

The above hologram lenses have a circular or elliptical shape in the screen body.

The above hologram lenses have a regular polygonal shape in the screen body.

The each of above hologram lenses may be a set of lenses.

The present method for manufacturing the hologram projection screen includes the following steps:

1) Recording hologram lens information on a photoresist plate;
2) Metalizing the photoresist plate that has been exposed, to produce the nickel master plate of a hologram lens array through electroforming and recombining;
3) Using the above master plate to emboss thermoplastic material, so as to obtain a screen body, on which the information of the hologram lens array is arranged.

Preferably, the above step 1) includes the steps of:

a) dividing a laser beam into two paths by a beam divider, one path is used to obtain the objective light of the lens, the other path is used as a reference light, the objective light and the reference light converge onto the photoresist plate with an angle therebetween, to expose the photoresist;
b) a computer controls the on/off of the shutter and the movement of the photoresist plate, to make the on/off of the shutter of the camera harmonize with the movement of the photoresist plate, thereby equally recording the information of a plurality of hologram lenses on the photoresist plate.

Preferably, the above thermoplastic material used in step 3) is transparent material, such as polyester, polyvinyl chloride, polycarbonate or biaxial oriented polypropylene.

Preferably, the above method further includes step 4) after step 3):

4) coating a protection layer on the hologram lens array after embossing.

In step 4), the protection layer is a layer comprised of (made up of) transparent or semi-transparent medium.

In step 4), the protection layer is a layer made up of metal reflective material.

The present system for manufacturing hologram projection screen includes at least a computer, a laser generator, a shutter, a beam divider, lens and photoresist plate, wherein: the laser generator emits a laser beam, which is divided into two paths by the beam divider: one path is used to obtain the objective light of the lens and the other path is used as a reference light; the objective light and the reference light converge onto the photoresist plate at an angle.

The shutter is arranged in front of the laser beam and is used to control the exposure of the objective light and the reference light on the photoresist plate.

The computer controls the on/off of the shutter, the exposure degree and the movement of the optical etching plastic plate, to make the on/off of the shutter harmonize with the movement of the photoresist plate.

Preferably, the above system further includes two spatial filters, arranged in the path of the objective light and in the path of the reference light separately, to filter the corresponding light.

The spatial filters include a beam expander and a pinhole, the beam expander being arranged in front of the pinhole.

The method for applying the present hologram projection screen includes: opposite to the side of viewing position, which is on one side of the screen body, a particular object is positioned on the other side of the screen body.

In another method for applying the present hologram projection screen, in the images projected by the projector to the screen body, the information of the images is composed of a series of stereoscopic image pair information in the same code.

The advantageous effect of the present invention is that, the present hologram projection screen manufactured based on the principle of hologram lens and the technology of embossing hologram, which may be a transparent or semi-transparent display screen, makes it possible for a viewer to also watch the images on the back of the screen through the screen while viewing the images on the screen. Moreover, the images seem to be floating in the air and even seem like three-dimension images, thereby providing the viewers with a fresh and attractive experience.

The present invention may also use a reflective display screen. Since there is a notable angle between the projection direction and viewing direction and the gain thereof is much larger than a conventional diffuse reflection screen, the invention can be widely used where the projector needs to be kept secret to replace the present LED screen. That is to say, the present hologram projection screen can provide an optimal visual effect in and out of houses due to its high permeance of light, high luminance and high contrast, and thus it can be used widely in exhibition windows, exhibition houses, stores, banks, museums and so on.

BRIEF DESCRIPTIONS OF THE DRAWINGS

Figure 2:
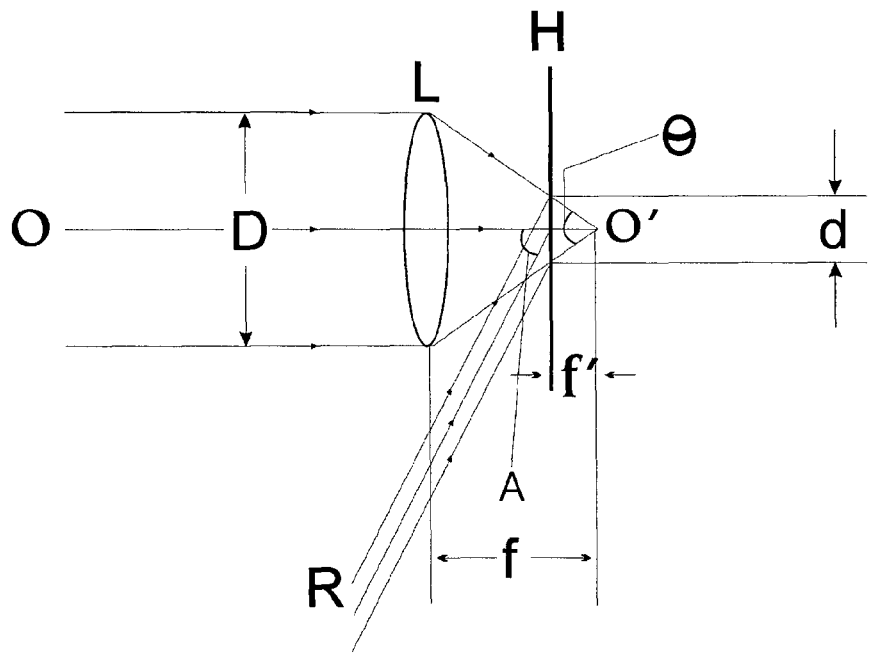
Figure 3:
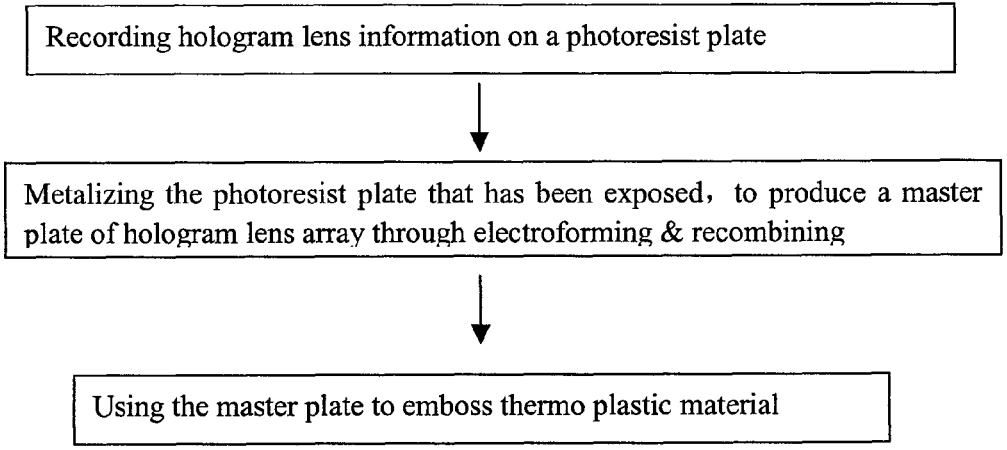
Figure 4:
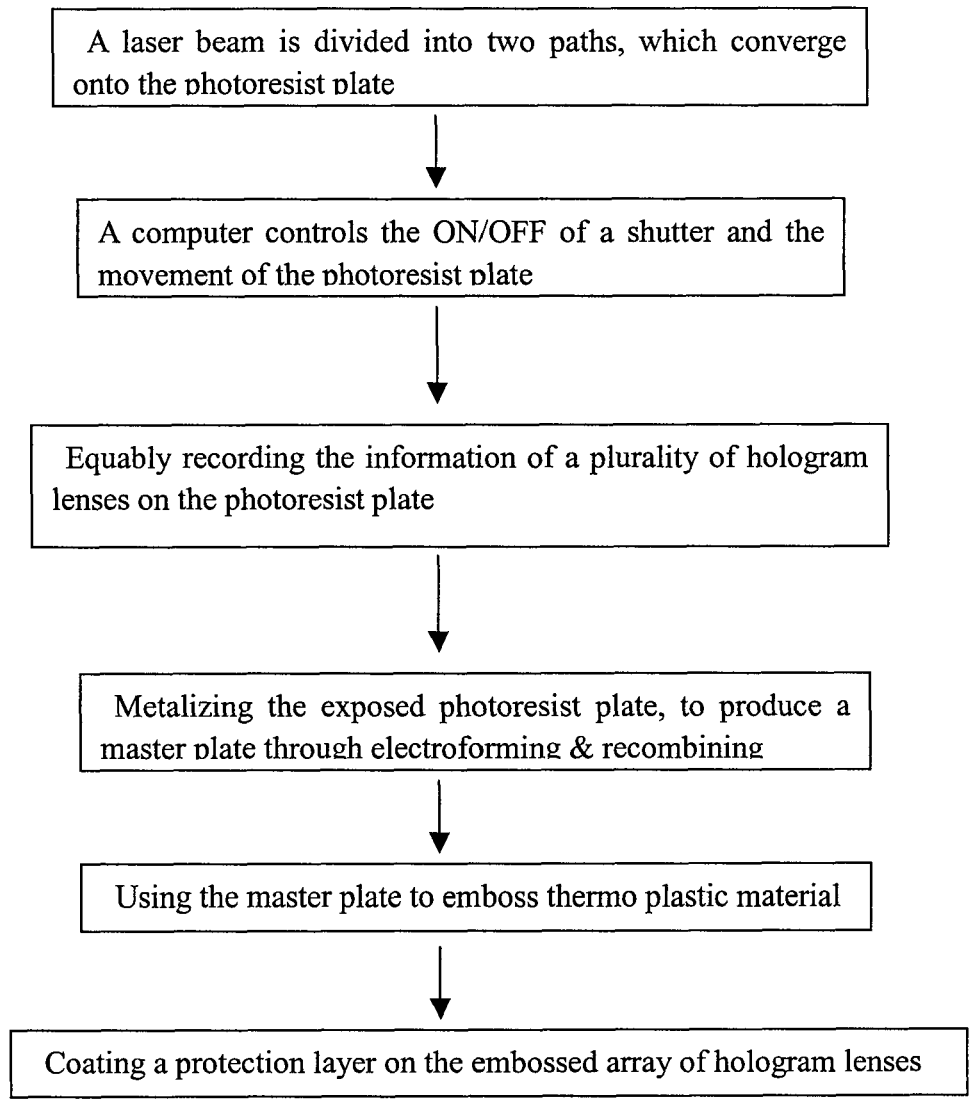
Figure 5:
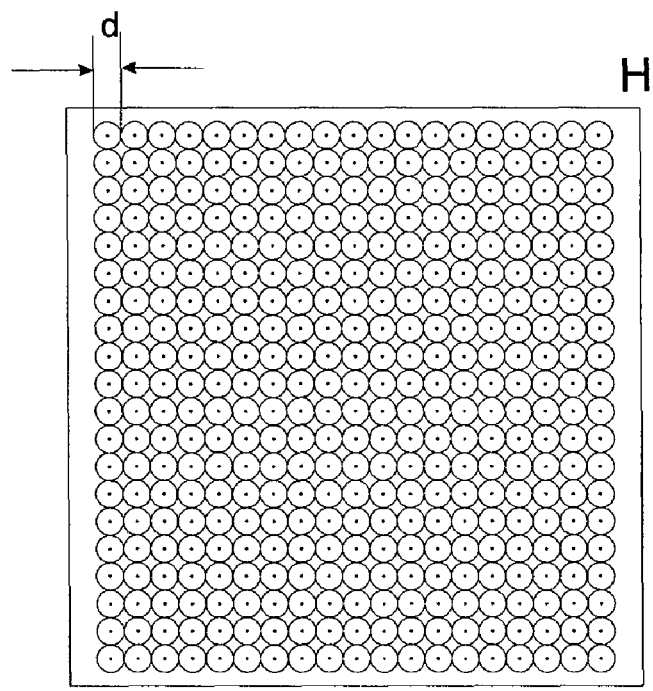
Figure 6:
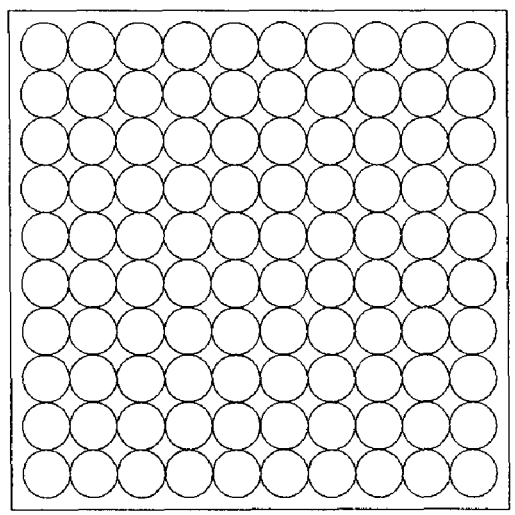
Figure 7:
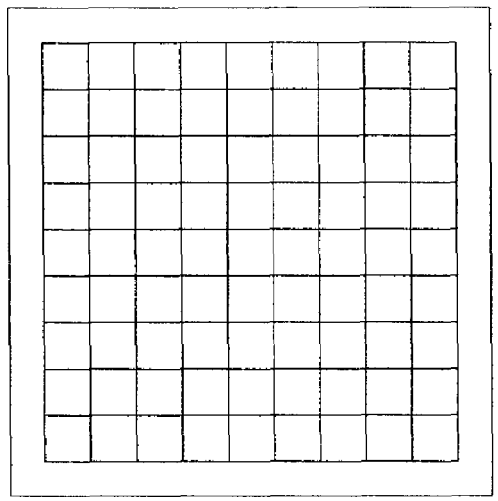
Figure 8:
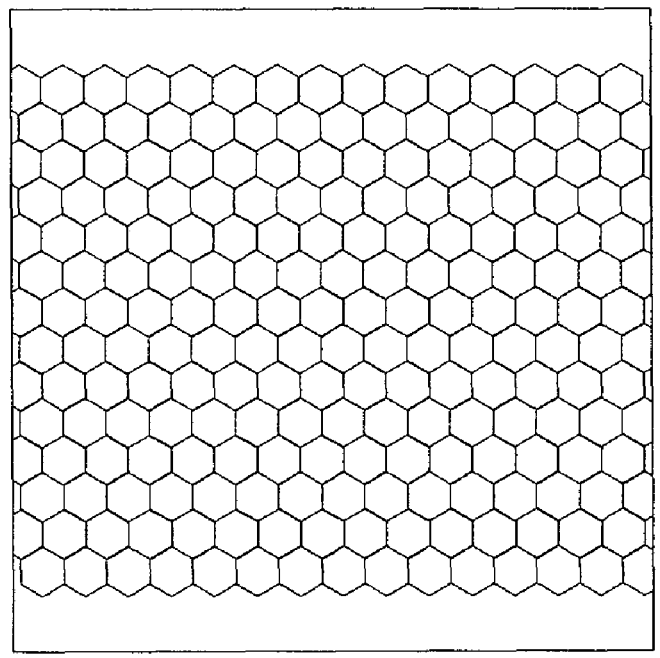
Figure 9:
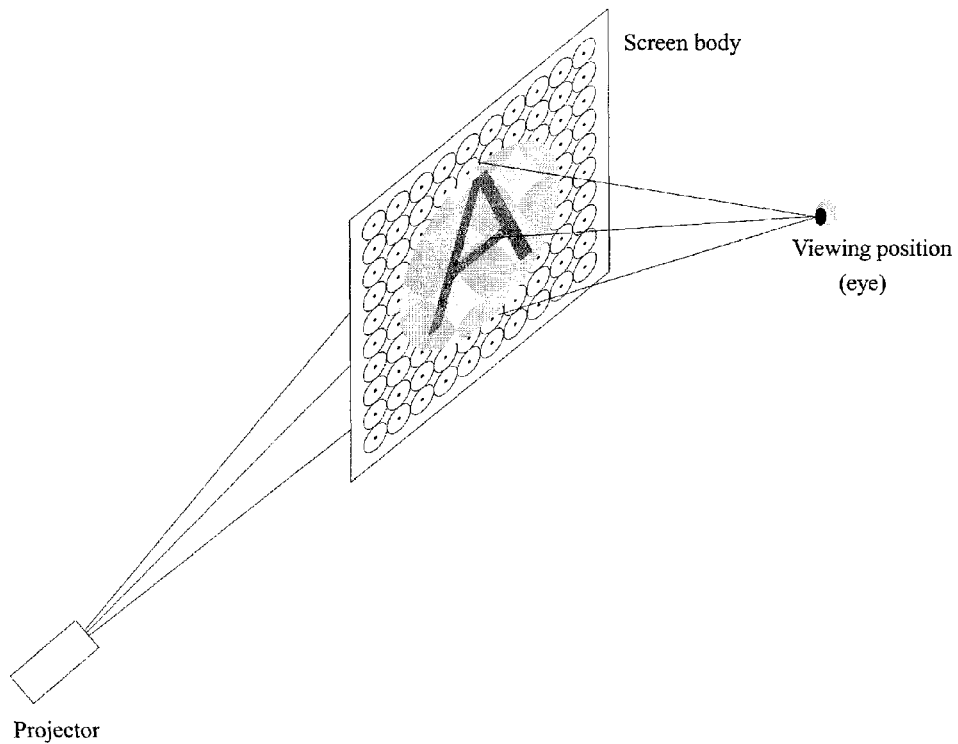
Figure 10:
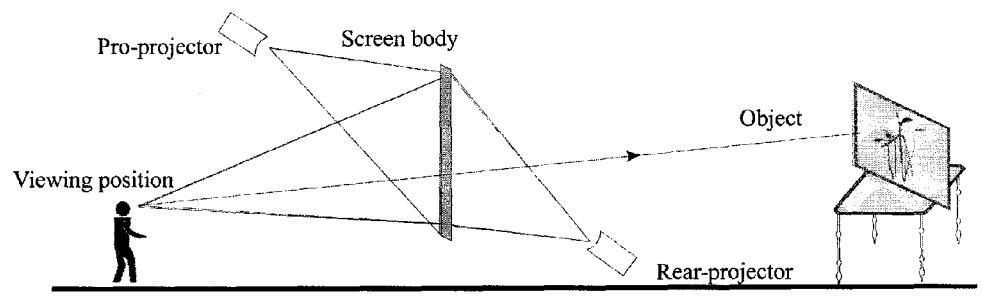
Figure 11:
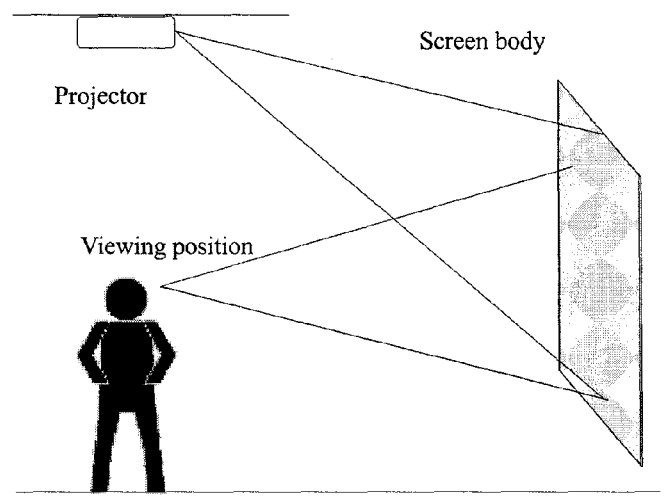
Figure 12:
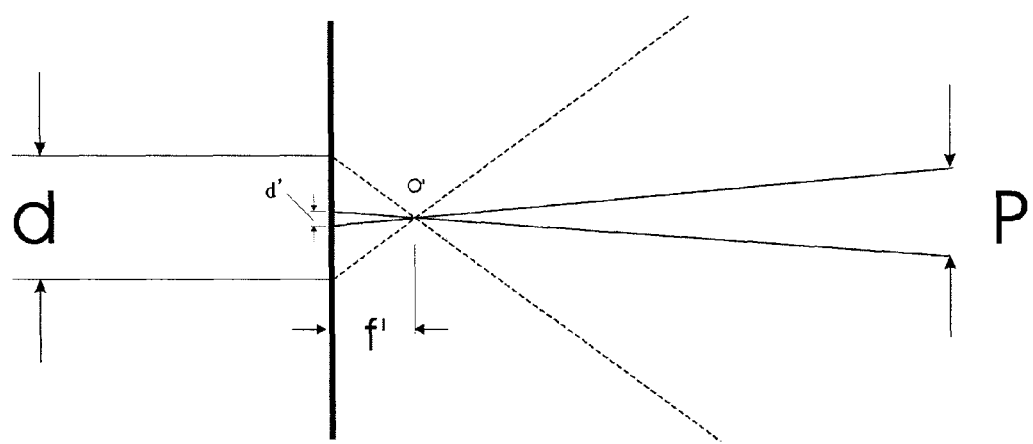
Figure 13:
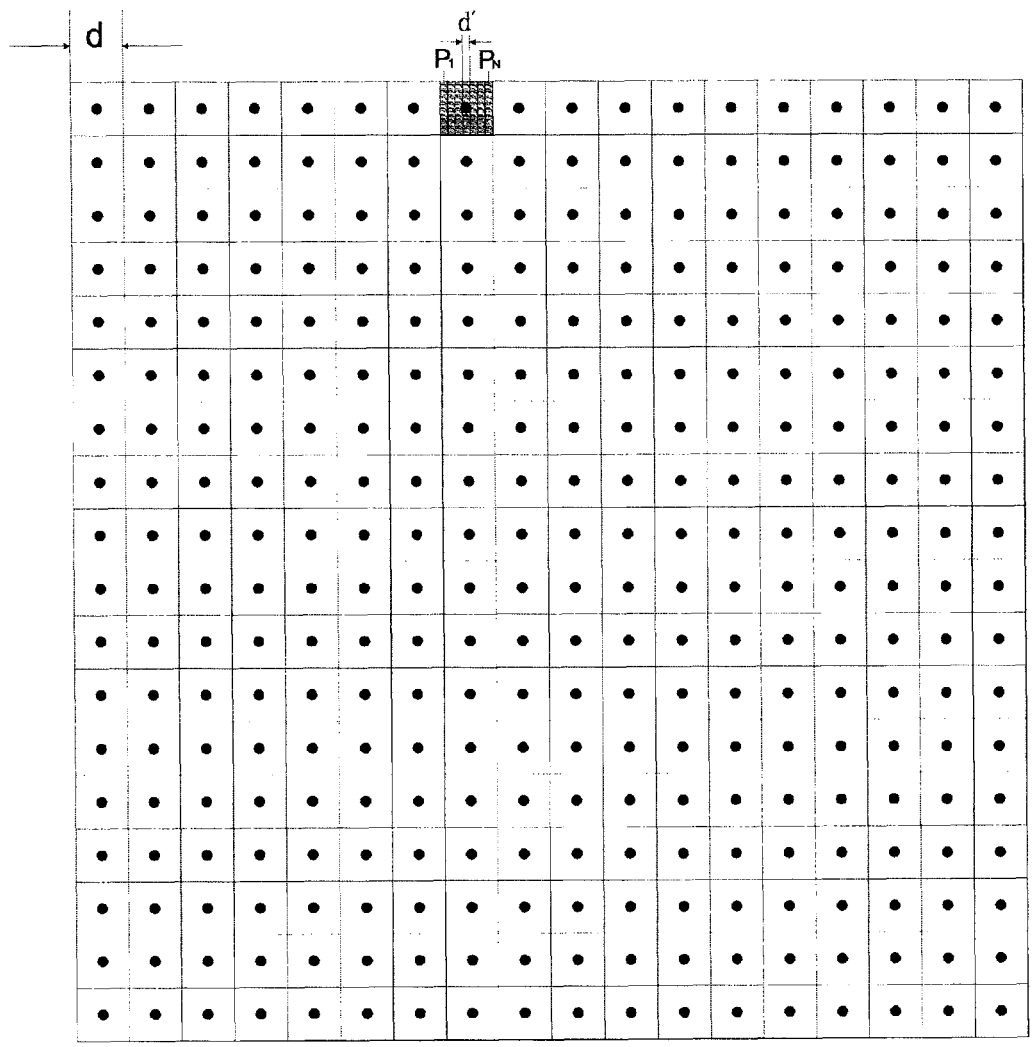
Figure 14:
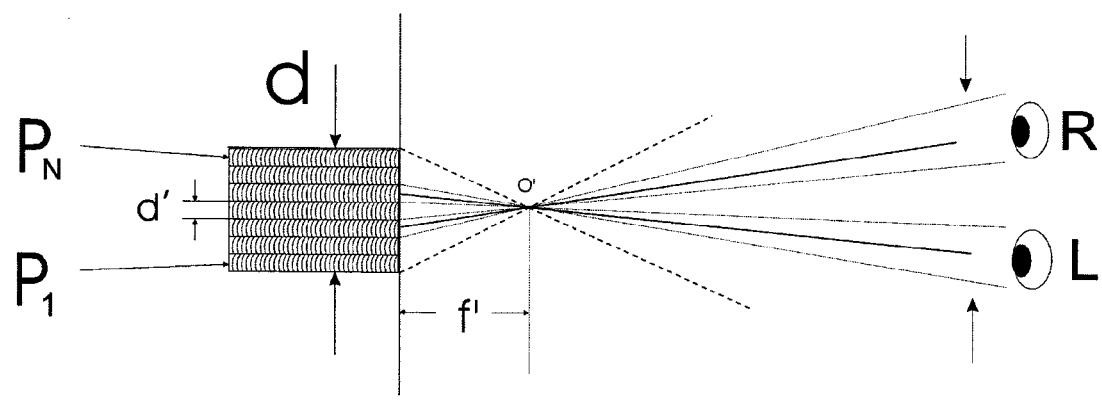

FIG. 1 displays an optical structure of the present manufacturing system;

FIG. 2 displays a principle of recording information of the present hologram lens;

FIG. 3 displays a general flowchart of a manufacturing method of the present invention;

FIG. 4 displays the detailed flowchart of manufacturing method of the present invention;

FIG. 5 displays the information arrangement of the present hologram lens array;

FIG. 6 displays an exemplary (circular) shape of the present hologram lens array in the screen body;

FIG. 7 displays an exemplary (square) shape of the present hologram lens array in the screen body;

FIG. 8 displays an exemplary (regular hexagon) shape of the present hologram lens array in the screen body;

FIG. 9 displays an exemplary projection and imaging of the present invention;

FIG. 10 displays an exemplary application of the present invention;

FIG. 11 displays an exemplary application of the present invention;

FIG. 12 displays a viewing state of a viewer's eye in the present invention;

FIG. 13 displays an exemplary hologram of images containing a plurality of stereoscopic image pairs displayed on a screen body;

FIG. 14 displays a viewer's eyes watching images containing a plurality of stereoscopic image pairs (Planform).

DETAILED DESCRIPTIONS OF EMBODIMENTS

Detailed descriptions will be made with reference to the accompanying drawings and embodiments.

As shown in FIG. 1, the present manufacturing system includes a computer 1, a laser generator 2, a shutter 3, a beam divider 4, a photoresist plate 5, lenses 61, 62, spatial filter 8 and reflective mirror 91, 92.

As shown in FIG. 1, laser generator 2 generates a laser beam, which is divided into two paths through beam divider 4, one path being used to obtain the objective light of lens 61, and the other path being used as a reference light. The objective light and the reference light converge with an angle therebetween onto photoresist plate 5. Spatial filter 8 is disposed in the middle of the paths of the objective light and reference light, which includes a beam expander 81 and a pinhole 82, the beam expander 81 being located in front of the pinhole 82. Two filters 8 filter the objective light and reference light separately.

As shown in FIG. 1, a shutter 3 is disposed in front of the laser beam, to control the exposure of the objective light and reference light on the photoresist plate 5. Computer 1 controls the on/off of shutter 3, the degree of exposure and the movement of photoresist plate 5, to make the on/off of shutter 3 harmonize with the movement of photoresist plate 5.

As shown in FIG. 1, the path of objective light is as follows:
Laser generator 2→shutter 3→beam divider 4→reflective mirror 92→spatial filter 8→lens 61→diaphragm 7→lens 62→photoresist plate 5

As shown in FIG. 1, the path of reference light is as follows:
Laser generator 2→shutter 3→beam divider 4→reflective mirror 91→spatial filter 8→photoresist plate 5

As shown in FIG. 2, objective light 0 focuses on focal point 0' through lens L, lens L having an aperture of D and a focal length of f. Hologram recording material H is disposed near focal point 0' with a distance of f' from the focal point 0'. The diameter of the facula of objective light on H is d. Reference light R arrives onto photoresist plate at an incident angle of A to record hologram, thus the resulted hologram corresponds to hologram lens with an aperture of d, focal length of f' and reproduced angle of A. i.e., its viewing field angle $\theta$ is the same as that of lens L, $2 tg\theta = D/f = d/f'$. Along the path shown in FIG. 1, hologram material H is moved in x-direction and y-direction by a distance of d, which is the aperture of the hologram lens, to sequentially expose the hologram material, thus an array H of hologram lenses, i.e., a hologram screen, is obtained. The minimum distinguishable distance thereof is the size of the hologram lens d.

As shown in FIGS. 1 and 3, the general manufacturing procedure of the present invention is as follows:

I) recording the information of hologram lenses onto photoresist plate 5 by exposure of objective light and reference light thereon;

II) metalizing the exposed photoresist plate, i.e., producing the nickel master of hologram lenses array through electroforming and recombining;

III) embossing thermoplastic material by the master, as shown in FIG. 5, to obtain the screen body on which the array of hologram lenses are arranged.

As shown in FIGS. 1 and 4, the detailed manufacturing procedure of the present invention is as follows:

1. A laser beam generated from laser generator 2 is divided into two paths by beam divider 4, one path being used for obtaining the objective light of lens 61, the other path being used as a reference light, the objective light and the reference light converge with an angle therebetween onto photoresist plate 5 to make it exposed.

2. Computer 1 controls the on/off of shutter 3 and the movement of photoresist plate 5, to make the on/off of shutter 3 harmonize with the movement of photoresist plate 5, so as to equally record the information of a plurality of hologram lenses. In the present invention, computer 1 controls the exposure time and exposure degree of shutter 3, and at the same time controls the movement of photoresist plate 5 in vertical direction and horizontal direction. As an example, computer 1 controls the rotation of fine stepping motor so as to cause photoresist plate 5 to move.

3. After a position is exposed, computer 1 controls photoresist plate 5 to move to another position to make it exposed. The above procedure is repeated until the information of a plurality of hologram lenses is recorded onto the photoresist plate 5, as shown in FIG. 5.

4. The photoresist plate is metalized after exposure, i.e., generating the array of hologram lenses through electroforming and recombining.

5. The next step is embossing thermoplastic material by utilizing the master plastic plate. The thermoplastic material may be transparent material, such as polyester, polyvinyl chloride, polycarbonate or biaxial oriented polypropylene. The embossed material may take the form of a hard plastic plate or thin film.

6. A protection coating is plated on the array of hologram lenses of the embossed thermoplastic medium. The protection coating may be of transparent or semi-transparent material, such as ZnS or $SiO_2$, or may be metal reflective material such as aluminum or copper. Finally, the screen body whose base material is thermoplastic material is obtained, as shown in FIG. 6, on which the arrays of hologram lenses are arranged.

In the present invention, as shown in FIG. 6, hologram lenses are arranged equally on the screen body vertically and horizontally, adjacent to each other. In steps 2 and 3, computer 1 controls the on/off of shutter 3 and the movement of photoresist plate 5, to make the on/off of shutter 3 harmonize with the movement of photoresist plate 5. The hologram lenses in FIG. 6 have a circular shape in the screen body. In the present invention, the shape of hologram lenses can be obtained by selecting the shape of incidence section of diaphragm 7. If the incidence section of diaphragm 7 has an elliptical shape, then the hologram lenses in the screen body have an elliptical shape. As shown in FIGS. 7 and 8, the hologram lenses in the screen body have a square shape and a regular hexagon shape separately. Compared with the hologram lens with circular shape or elliptical shape, hologram lens with square shape or regular hexagon shape will obtain a higher spatial ratio. As for selecting spatial ratio, it can be made based on practical requirements. Moreover, the hologram lens may be a spherical lens and when used practically the hologram lens may be a single lens or a set of lenses. In the case in which a set of lenses are used, it is equal to two or more lenses overlapping on a single position of the array of the hologram lenses on the screen body.

The method for using the present invention is shown in FIG. 9. The projector projects images onto the screen body. A viewer can watch the images from the viewing position. In the present invention, there is a notable angle between the viewing position (diffraction direction) and the projection direction (reproduction direction), so in many cases the projector can be kept secret or hidden. The luminance of the present invention is equivalent to that of the existing LEDs and so can replace the existing LED. However, the present invention has a higher resolution and flexibility and a lower power consumption than existing LEDs.

A typical application of the present invention is shown in FIG. 10. The screen body in FIG. 10 has a protection coating of transparent or semi-transparent material. From the point of the screen body, opposite to the side of the viewing position, a particular object is located on the other side of the screen body. Thus, whether a pro-projector or a rear-projector is used, while a viewer watches the projected images from the viewing position, he can always watch the object behind the screen body, but the light from the projector does not arrive at the viewer's eyes. This differs from the other conventional screen. There is an angle between the viewing direction and the projection direction, which makes it possible, that while watching the projected images a viewer can watch the object behind the screen body. By controlling the direction of the viewing position, the projected images seem like they are floating in the air, which is a completely fresh and attractive experience.

Another typical application of the present invention is shown in FIG. 11. The screen body in FIG. 11 has a protection coating of metal reflective material and can be used widely when the projector needs to be kept secret.

Another typical application of the present invention is shown in FIGS. 12, 13 and 14. The images information projected by the projector onto the screen body is composed of a series of stereoscopic image pairs in the same code. As shown in FIG. 12, one code corresponds to a plurality of stereoscopic image pairs, wherein d is the size of a pixel in the same code, P is the diameter of a viewer's pupil, f' is the focal length of hologram lens in the screen body. Since the projected images produced by each hologram lens will arrive at a viewer's eyes through the focal point, the pupil P of a viewer will receive only a portion of d' of the lens pixel through the focal point of the hologram lens.

As shown in FIG. 13, when the information of one pixel of each hologram lens in the screen body is composed of a series of stereoscopic image pairs $P_1 \ldots P_N$ in the same code, as shown in FIG. 14, the left eye and right eye of a viewer will receive different images (information). Thus, a parallax will be produced and so the view can see a three-dimension image, i.e., three-dimension projection can be realized.

The invention claimed is:

1. A method for manufacturing a hologram projection screen to form a projected holographic image, comprising the steps of:

dividing a laser beam into two paths by a beam divider, one path being used to obtain objective light of a hologram lens and the other path being used as a reference light, said objective light and said reference light converging onto a photoresist plate;

focusing said objective light through said lens at a focal point O', said lens being disposed at a focal length f' from said focal point O', positioning said photoresist material at a distance off from said focal point O' such that a facula of said objective light passing through said lens onto said photoresist plate has a diameter of d, converging said reference light with said objective light onto said photoresist plate at an incident angle A from a direction that said objective light is incident on said photoresist plate, to thereby record a hologram lens having an aperture equal to said diameter d, a focal length equal to said distance f' and a reproduced said angle of A, said hologram lens having a viewing field angle θ equal to said diameter d/said distance f';

opening and closing a shutter to control passage of said objective light and said reference light and exposure of the said photoresist material;

controlling by computer the shutter opening and closing and movement of said photoresist plate by a distance of said hologram aperture, which is equal to said diameter d, to make said shutter opening and closing harmonize with the movement of said photoresist plate;

repeating steps of: exposing one position of said photoresist plate, moving said photoresist plate and exposing another position of said photoresist plate, until information of a plurality of said hologram lenses is recorded as a hologram lens array onto said photoresist plate;

metalizing said photoresist plate that has been exposed, to produce a nickel master of said hologram lens array through electroforming and recombining;

using the above master nickel plate to emboss transparent or semi-transparent thermoplastic material, to form a screen body, on which a transparent or semi-transparent said hologram lens array is arranged, wherein each said hologram lens in said hologram lens array functions as a hologram lens pixel, and wherein each said hologram lens pixel displays images projected from a projector as holographic images diffracted to be viewed with a notable angle between a viewing position and a projection direction, wherein each said hologram lens pixel is not so configured as to correspond to each pixel in said projector or a preselected group of pixels in said projector, wherein said transparent or semi-transparent screen body provides an effect that said holographic images seem to be floating in the air.

2. A method for manufacturing a hologram projection screen according to claim 1, wherein said screen body consists essentially of said transparent or semi-transparent hologram lens array.

* * * * *